United States Patent [19]

Rice

[11] 3,961,905
[45] June 8, 1976

[54] CRUCIBLE AND HEATER ASSEMBLY FOR CRYSTAL GROWTH FROM A MELT

[75] Inventor: Dale W. Rice, Horseheads, N.Y.
[73] Assignee: Corning Glass Works, Corning, N.Y.
[22] Filed: Feb. 25, 1974
[21] Appl. No.: 445,630

[52] U.S. Cl. .......................... 23/273 SP; 23/301 SP; 432/262; 432/265
[51] Int. Cl.² ...................... B01D 9/00; B01J 17/18; F27B 14/10
[58] Field of Search .................. 23/273 SP, 301 SP; 432/156, 262, 265; 13/DIG. 1, 13 ZM; 219/10.49

[56] References Cited
UNITED STATES PATENTS

| | | | |
|---|---|---|---|
| 2,992,517 | 7/1961 | Hicks, Jr. | 23/273 SP UX |
| 3,015,592 | 1/1962 | Leopold | 23/273 SP X |
| 3,551,115 | 12/1970 | Jamieson et al. | 23/273 SP |
| 3,591,348 | 7/1971 | LaBelle, Jr. | 23/273 SP X |
| 3,687,633 | 8/1972 | Belle, Jr. et al. | 23/273 SP |
| 3,877,880 | 4/1975 | Kuhlmann-Schafer | 23/301 SP |
| 3,881,037 | 4/1975 | Grandia et al. | 23/301 SP |

Primary Examiner—Morris O. Wolk
Assistant Examiner—Barry I. Hollander
Attorney, Agent, or Firm—Barry S. Bissell; Richard N. Wardell; Clarence R. Patty, Jr.

[57] ABSTRACT

An annular crucible for containing molten, inorganic crystalline material in an apparatus for growing a plurality of substantially monocrystalline articles including a plurality of spaced forming members disposed in a ring-like arrangement within the crucible, and a pair of annular resistance heating elements concentric with the annular crucible, one element proximate the crucible inner wall and one element proximate the crucible outer wall. In combination with the annular crucible, a thin, ring-shaped resistance heating element substantially conforming in outside and inside diameters to those of the crucible and being disposed at a predetermined distance above the crucible, the ring element having apertures for passing the monocrystalline articles and having means for an independently controllable heat output.

8 Claims, 4 Drawing Figures

CRUCIBLE AND HEATER ASSEMBLY FOR CRYSTAL GROWTH FROM A MELT

BACKGROUND OF THE INVENTION

The invention relates to the art of growing and pulling substantially monocrystalline bodies from melts of various crystalline inorganic materials. In particular, it relates to an improved crucible for containing the melt and an improved disposition of forming members and heating elements in combination with the improved crucible, for reducing the thermal gradients within the melt which are inherent in the prior art apparatus.

The invention is most useful when pulling a plurality of substantially monocrystalline objects (for example, twenty single crystal alpha-alumina tubular bodies) at one time. The prior art suggest that a large pot-shaped crucible be used with several die or forming members disposed in any arrangement in the crucible and adapted to extend above the surface of the melt in the crucible. (For example, see U.S. Pat. No. 3,687,633, FIG. 7). The crucible contents (including die or forming members) are then heated by means of an induction coil and susceptor arrangement or a resistance element surrounding the entire crucible. However, because of the large size of the crucible and because of the numerous die assemblies which lose heat at their upper surfaces rising above the melt level in the crucible, temperature gradients are built up throughout the melt which, in sequence, lead to undesirable convection currents which, together with the high temperatures, cause rapid attack on the crucible and forming members. The gradients and currents in the melt are higher in magnitude than those expected in smaller crucibles of lesser volume. Further, each addition of a forming member to the melt, and each increase in the size of the crucible may drastically affect the temperature distribution throughout the melt. A new problem in controlling the temperature is presented to the experimenter with each change in crucible size, change in the number of forming members of change in the arrangement of forming members.

The thermal gradients in prior art apparatus as described above are also increased by heating the crucible and contents therein in excess of the melting point of the contents. This higher heat imput is necessary in order to maintain the melt in the crystal growing region at its melting temperature. In particular, if the melt is to be shaped by a forming surface rising above the melt level, the film of melt on the forming surface and the surface itself must be conductively heated through the melt, requiring therefore, increased heat input to the crucible and contents.

SUMMARY OF THE INVENTION

It is an object of the present invention to reduce the occurrence and magnitude of thermal gradients and consequent convection currents within a melt of inorganic crystalline material that melts substantially congruently during growth and withdrawal of a plurality of crystalline articles from the surface of the melt or from a film of the melt upon a forming member positioned in and extending above the surface of the melt.

It is an object of this invention to provide a crucible apparatus for containing a melt used in a process of growing crystals from the melt wherein the crucible provides space for growing a plurality of substantially monocrystalline articles, yet reduces the thermal gradients within the melt associated with prior art apparatus.

It is a further object of the invention to provide a combination of heating elements and crucible, whereby an independent heating element directly heats the upper surface of a forming member positioned within and extending above the melt, thereby allowing a reduction in the melt temperature; the melt formerly being the indirect source of heat to the forming member upper surface.

In particular, it is the object of the present invention to provide a crucible and a heating element arrangement complementary with the crucible which provide substantially uniform temperature throughout a melt of inorganic crystalline material (most particularly alumina) contained within the crucible and used in an apparatus for growing a plurality of substantially single crystal tubes from films of melt on the surfaces of forming members positioned in and extending above the melt.

In furtherance of the objectives, the inventor provides an annular crucible with a generally "U" shaped cross-section made from a material which will survive (i.e. is resistant to) the thermal and chemical attack of the inorganic material melt contained therein. The annular crucible has an inner annular wall and an outer annular wall, with the spacing therebetween preferably wide enough to properly admit only one forming member used in the crystal pulling procedure and with the space between each wall and each forming member being great enough for physical movement of the forming member and for convenience of fabrication and assembly of the entire crystal pulling apparatus. A plurality of forming members for pulling a plurality of substantially monocrystalline bodies can be arranged in a ring-like arrangement within the annular space.

A primary feature of the present annular crucible involves the relative simplicity of scaling-up a small crucible or increasing the number of forming members in a larger crucible. With a prior art pot-shaped crucible, any additional forming member placed in the crucible and any increase in the crucible diameter causes a new problem in thermal gradients. The temperature distribution throughout the whole melt is upset. To the contrary, the annular crucible of the present invention behaves like a plurality of small independent crucibles, so that even if the outside diameter is increased, the spacing between the crucible inner annular wall and the crucible outer annular wall remains substantially constant (preferably wide enough to properly accept only one forming member); consequently, the gradient across the melt at any radial location is not altered drastically by the increase. Additional forming members placed in the melt within the ring-like arrangement of forming members extending concentrically inside the annular crucible, likewise do not have a drastic effect on the temperature distribution surround pre-existing forming members so long as some spacing is maintained between adjacent forming members (e.g. spacing at least equal to the spacing between such members and adjacent crucible walls). The spacing between forming members is also adjustable for the convenience of assembly of the apparatus superstructure including heating elements, afterheater and the crystal puller itself.

A heating means is also provided which produces, in combination with the annular crucible, a substantially uniform distribution of temperature within the melt. A pair of heating elements is utilized, with one element near the crucible outer annular wall and one element near the crucible inner annular wall. The heating elements are preferably annular and concentric with the crucible for a more even heat distribution over the crucible surface and throughout the melt. The elements are also preferably electrical resistance elements although susceptors may be used if electrically inductive heating is preferred. Obviously the crucible may be inductively heated directly without using separate susceptors. In addition, some other form of radiant heating may also be feasible although it is not preferred.

A further heating means is provided which is disclosed as a thin (in the axial direction), ring-shaped heating element (preferably electrical resistance element) substantially concentric with the annular crucible and disposed at a predetermined distance above the melt surface or crucible and having means for independently controlling its heat output. Preferably the outside and inside diameters of the ring-shaped element are comparable with the respective diameters of the crucible. In addition, the ring element has apertures which are of such size and such arrangement that each forming member upper surface may pass untouched and without electrical discharge thereto through an aperture if the ring element is disposed at least in part below the level of the forming member upper surface. The ring element provides a means of independently controlling the temperature in the crystallization region and a means of directly heating the upper surface of and the liquid film on a forming member contained in the melt.

DETAILED DESCRIPTION OF THE INVENTION

Substantially monocrystalline shapes may be formed by a so-called "crystal pulling" process from a melt in which a small piece of single crystal of the melt material (or "seed") is oriented and dipped into a melt or into a film of the melt at the upper portion or on the flat upper surface of a forming member positioned in and extending above the melt. The temperature is closely controlled, especially at the point of contact of the melt with the seed. Above the melt surface or film, the temperature is below the melting point of the melt material and crystallization occurs on the seed. The seed is withdrawn at a rate not exceeding the rate of crystal growth at the solid-liquid interface, and a continuous length of substantially monocrystalline material is formed thereby. Using this process and a forming member, various elongated shapes conforming in cross-section to the shape of the forming member can be produced. Such methods and forming members are known in the art; for example see U.S. Pat. Nos. 3,471,266 and 3,591,348. Inorganic materials which can be crystallized in this fashion are also known in the art and include beryllium, boron and refractory oxides such as BeO, MgO, $ZrO_2$, $\alpha$-$Al_2O_3$, $MgAlO_4$ and oxides with complex structures, such as garnet and perovskite. The growth of other metals and semiconductors (in particular silicon or germanium) is also feasible. Such materials may contain impurities or dopants that do not effect the desired crystallization. In addition, a number of polycrystalline bodies may be directionally solidified in such apparatus from eutectic melts contained in the crucible. Such binary eutectic melts known in the art include both metals, oxides and combinations thereof, for example Cd-Zn, $MgO$-$UO_2$, and W-$UO_2$. But although the polycrystalline bodies can be produced using the apparatus of the invention, the inventor prefers its use in growing substantially monocrystalline bodies.

Figure 2:
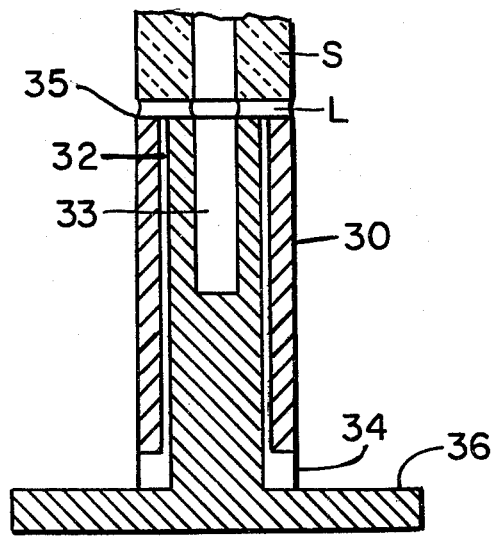
FIG. 2 is one prior art forming member which may be used in conjunction with the invention.

Of particular interest is the apparatus used to grow a plurality of substantially single crystal tubular objects using forming members similar in function to that shown in FIG. 2. In one crystal growing process, a forming member 30 with a base 36 is disposed in the crucible (not shown) with an upper surface 35 above the melt surface and generally above the crucible. The melt is drawn to the surface 35 by capillary action through passages 34 and capillaries 32 and forms a film which conforms to the upper surface 35. The film (liquid L in the drawing) then contacts the seed crystal and solidifies (solid S) with the same cross-sectional configuration as the forming member upper surface 35. The central hole 33 in the forming member allows production of crystalline bodies with axial cavities therein. Other forming members which are functionally equivalent, though they may not use capillary flow, are equally usable. Substantially monocrystalline bodies with cross-sectional shapes other than tubular (e.g. solid filaments, ribbons, etc.) may be produced with the present invention by selecting forming members of appropriate corresponding shape. Furthermore, there is no apparent reason why a large single tube could not be pulled from a single annular forming member positioned concentrically in the crucible.

In a commercial operation of tube drawing, it is generally most economical to use a plurality of forming members for drawing a plurality of articles in one crystal pulling apparatus. For example, the present invention may be used in an apparatus for drawing 20 or more substantially monocrystalline tubes at one time.

Figure 1:
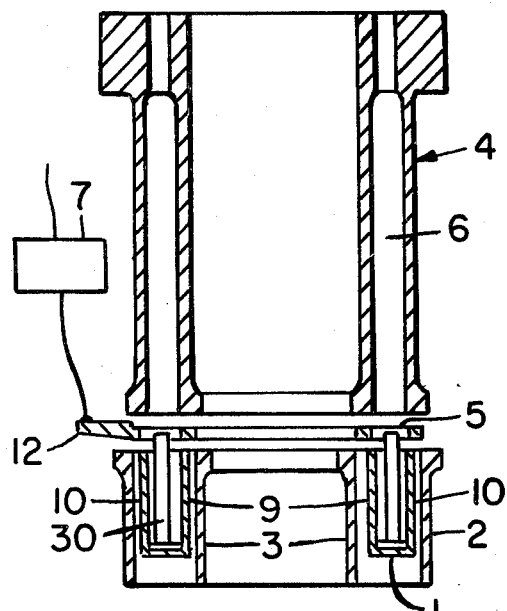
FIG. 1 shows the melting and crystallization-solidification regions of an apparatus for pulling crystals from the melt. Shown is a cross-sectional view of the crucible, forming members, crucible heaters, independent ring-shaped element or crystallization zone heater, and after-heater assembly.

Looking at FIG. 1, a plurality of forming members 30 (also known as die bodies) are disposed in a melt of material in a ring-like arrangement at various intervals around the novel annular crucible 1. The crucible is an annular channel with a generally U shaped cross-section and consists of integral bottom member, inner annular wall 9 and outer annular wall 10. In the case when the melt is alumina, the crucible 1 may be made substantially of molybdenum, tungsten, iridium, rhenium, with or without other elements alloying with the metals. In the case when the melt is any other inorganic crystallizable material, the crucible may be made from a material which will survive thermal and chemical attack of the particular melt, which material may often be one of the aforementioned metals or alloys.

The level of melt in the crucible is kept below the upper surface of the forming member but high enough in the crucible to retain a capillary flow to the upper surface through the capillaries of the forming member. Make-up of the melt may be made by direct additions of particulate material or pre-melted material.

A pair of annular graphite resistance elements 2, 3 are used to heat the crucible 1 and are preferably concentric with the crucible. Element 2 is spaced at a predetermined distance (typically one-quarter to one-half inch) from the crucible outer annular wall 10 and element 3 is spaced at a predetermined distance (again preferably one-quarter to one-half inch) from the crucible inner annular wall 9. The elements 2,3 are shown with a lip on the upper end thereof but the shape of the element is variable by the operator, realizing of course, that the shape of the resistance element and, in particular, its thickness controls the resistance at each point in the element and therefore controls the heat distribution across the whole element. The annular elements 2 and 3 are generally positioned so that they are even with or below the upper surface of the forming member 30. Normal power feed connections (not shown) may be made to the elements.

Shown in combination with a plurality of forming members 30 and the crucible 1 in FIG. 1 is an independent ring-shaped graphite resistance element 12 which is disposed in the crystal growing region above the crucible 1 and electrically connected to a power controller 7 independently of the crucible heaters. The exact position of the ring element above the melt surface or the crucible may be determined by the experimenter depending on the growing conditions desired. In a preferred normal assembly, the ring element is thin (less than three-eighths inch thick) in the direction parallel to the axes of the apertures 5 therein and is positioned in the crystallization region with the ring element bottom surface positioned anywhere above the crucible (or melt surface) up to immediately below or at about the level of the forming member upper surface such that the temperature of the forming member upper surface is under the influence of the heat supplied by the ring element. Typically, the temperature of the forming surface is approximately that of the melting temperature of the melt material; the exact temperature is adjusted however to control the thickness of the melt film on the forming surface. Therefore, the proper film thickness for producing good monocrystalline bodies is maintained by controlling both the temperature of the ring element and its position with respect to the forming member upper surface. It will be apparent to a routineer in the art that even if the ring element temperature is above the melt temperature and the ring element upper surface is above the forming member upper surface, the melt can still crystallize in the region below the level of the ring element upper surface since (due to heat loss) the temperature near the crystal is lower than the temperature near the ring element itself and, in addition, the crystal acts as a heat sink to lower the temperature at the crystal-melt surface. The inventor prefers that the ring element upper surface be fixed not more than one-quarter inch below nor more than one-quarter inch above the level of the forming member upper surface and that the temperature be then adjusted to effect the proper melt film thickness on the forming member upper surface. The power to the ring element 12 is varied independently of the crucible heating elements by means of a power controller 7, for example, a variable transformer which controls the power to the ring element to effect such a temperature adjustment for optimum crystal growing conditions in the space above the forming member.

The ring element is located above the crucible in FIG. 1. This is the normal preferred case because the forming surface is normally above the crucible. If, however, the forming surface is below the top of the crucible (but above the melt) then the ring element may also be below the top of the crucible. In this case, the ring element would, of course, have a larger inside diameter and a smaller outside diameter than the crucible. This arrangement is not preferred in that it necessitates more elaborate electrical connections and supporting means than if the ring element were above the crucible.

Without the ring element 12, the upper portion of forming member 30 must be heated indirectly by conduction through the melt and the lower portion of member 30. The temperature of the crucible 1 and the melt must be high enough to keep the forming member upper surface at or above the melting point of the melt material. This usually requires that the crucible and the melt be heated far in excess of the melting point of the melt material, thereby increasing the wear on the crucible. With the ring element 12 in place, the upper portion of forming member 30 may be heated directly, and the temperature of the crucible can be lowered to just above the melting point of the material. For example, if alpha-alumina is the material to be crystallized, the temperature to be maintained at the forming member upper surface is about 2050°C., the melting point of $\alpha$-$Al_2O_3$. Without the ring element 12, the crucible and melt would have to be heated to around 2150°C. in order to maintain the forming member upper surface at 2050°C. With the ring element 12, the temperature of the crucible and melt may be lowered to about 2075°C., or 75° less than necessary without the ring element.

Figure 3:
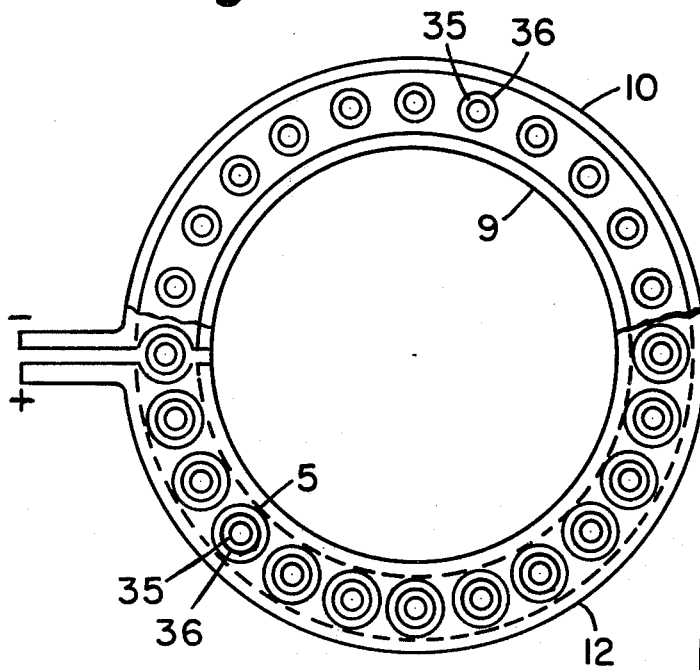
FIG. 3 is a plan view of the ring-shaped crystallization zone element and the annular crucible of FIG. 1 showing the ring-like arrangement of 24 forming members inside the crucible. The breakaway of the ring element exposes the crucible and the ring-like arrangement of forming members disposed in the crucible. The forming members are shown for simplicity as merely a base 36 and an upper forming surface 35. The ring element apertures are centered over each forming member.

The ring element 12 is shown in FIG. 3 along with the annular crucible and the crucible inner annular wall 9 and the crucible outer annular wall 10. Less than half of the ring element has been broken away in FIG. 3 to show the forming members in the annular crucible. For simplicity each forming member is represented by a base 36 and an upper forming surface 35. The ring element 12 is shown with apertures 5 centered over each forming member. The apertures are large enough to accept the upper surface 35 of the forming member without contact or electrical discharge therebetween, or if the ring element is disposed entirely above the forming member upper surface 35, then large enough to accept the substantially monocrystalline bodies pulled from each forming member. Some of the forming member positions may be vacant to allow space for raw material resupply to the crucible.

Figure 4:
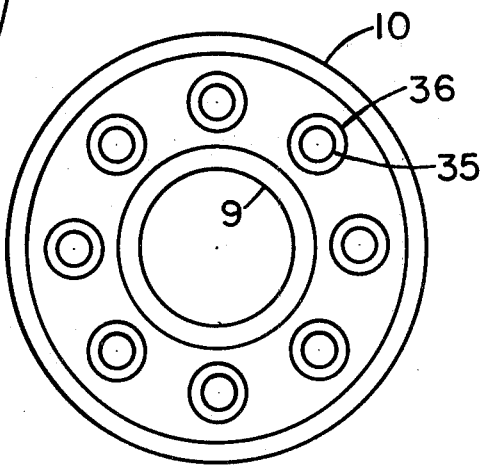
FIG. 4 is a plan view of an annular crucible with eight forming members in a ring-like arrangement in the crucible.

An eight position crucible is included as FIG. 4 to underscore the scaleability feature of the annular crucible. Looking at the 24 die position crucible of FIG. 3, which may be 4 inches inside diameter and 5¾ inches outside diameter, and the eight die position crucible of FIG. 4, which may be 1 inch inside diameter and 2¾ inches outside diameter (reference numbering is consistent), it can be seen that the forming members (having ¼ inch outside diameter forming surfaces and ⅜ inch bases to yield a tube having a ¼ inch outside diameter and a 0.020 inch wall) in each crucible are subjected to very similar thermal conditions based on the constant distance (for example one-eighth inch) from the crucible walls and the constant distance (for example ⅝ inch center to center) from the nearest neighbor forming member. The similarity allows an experimenter to transfer knowledge learned in a small crucible with a few forming members to a larger crucible with many forming members. For this reason, the inventor prefers but does not require that the spacing between the crucible inner annular wall and outer annular wall be wide enough to properly admit only one forming member (with sufficient space between the forming member and the walls for physical movement of the forming member). A crucible with an annular space sufficient to admit, radically side by side, more than one forming member may therefore be fabricated according to the invention and it may still derive the benefit of the pair of annular crucible heaters; but the benefit derived from minimizing the spacing between the pair of crucible heaters and consequently minimizing the thermal gradients radially across the melt will not be realized. In addition, the ease of scaling up a small crucible may be lost.

The remaining electrical resistance heating element in FIG. 1 is the afterheater 4, also an annular element. The afterheater 4 could consist of a solid graphite cylinder with a wall thickness large enough to accommodate holes 6 parallel to the cylinder axis through which the tubular crystals pass after crystallization from the melt. Whatever afterheating means is employed, the temperature in this region is controlled such that the temperature just above the ring element 12 is slightly below (perhaps 50°C.) the melting point of the material being crystallized. The temperature at the upper end of the afterheating means may be on the order of 200°C. cooler than the lower end. Such afterheating methods for control of the temperature gradient in a grown crystal are known in the art.

I claim:

1. In an apparatus for growing and pulling a plurality of crystalline articles from a melt of an inorganic, crystalline material, an improved crucible for containing the melt which comprises an annular channel with a generally U shaped cross-section adapted to contain the melt therein,
   a plurality of spaced forming members disposed in ring-like arrangement within the crucible and having upper portions adapted to be above the surface of the melt in the crucible, the upper portions including means for shaping and feeding the melt to a crystallization zone in which the articles grow, and the forming members including means for conveying melt from the crucible to the upper portions,
   a vertically adjustable ring-shaped heating element positioned concentric with the crucible and above the melt therein for providing heat to the upper portions and the crystallization zone, and having a plurality of apertures therethrough adapted and arranged to have the upper portions positioned at least partially therein in substantial axial alignment with axes of the apertures, and
   means operatively connected to the ring-shaped heating element for independently controlling the heat output thereof.

2. The apparatus of claim 1 wherein
   the means for shaping and feeding comprise upper surfaces of the forming members above the crucible for receiving and supporting a film of melt thereon,
   the means for conveying comprise capillary passages communicating with the upper surfaces and the portion of the crucible adapted to contain the melt, and
   the ring-shaped heating element is an electrical resistance element being thin in its vertical dimension and vertically positionable at a location ranging from a position where the lower surface of the ring-shaped element is substantially on the same horizontal level as the upper surfaces down to a position where the lower surface remains above the crucible.

3. In an apparatus for growing and pulling a plurality of crystalline articles from a melt, an improved combination of crucible and crucible heating means, wherein the combination comprises:
   an annular crucible having a generally U shaped cross-section and having a bottom portion, an inner annular wall and an outer annular wall,
   means outside of the crucible for providing heat directly to the crucible inner annular wall and to the crucible outer annular wall and for providing a substantially uniform radial temperature distribution in the melt between the inner annular wall and the outer annular wall, and
   a plurality of spaced forming members disposed in ring-like arrangement within the crucible and having upper portions adapted to be above the surface of the melt in the crucible, the upper portions including means for shaping and feeding the melt to a crystallization zone in which the articles grow, and the forming members including means for conveying melt from the crucible to the upper portions.

4. The apparatus as recited in claim 3 wherein the crucible heating means comprises a first annular heater and a second annular heater, the first annular heater being disposed substantially concentrically around the crucible outer annular wall and the second annular heater being disposed substantially concentrically around the crucible inner annular wall.

5. The apparatus as recited in claim 3 for growing and pulling substantially monocrystalline articles including
   a vertically adjustable ring-shaped heating element positioned concentric with the crucible and above the melt therein for providing heat to the upper portions and the crystallization zone, and having a plurality of apertures therethrough adapted and arranged to have the upper portions positioned at least partially therein in substantial axial alignment with axes of the apertures, and
   means operatively connected to the ring-shaped heating element for independently controlling the heat output thereof.

6. The apparatus as recited in claim 5 wherein the crucible heating means comprises a first annular heater and a second annular heater, the first annular heater being disposed substantially concentrically around the crucible outer annular wall and the second annular heater being disposed substantially concentrically around the crucible inner annular wall.

7. The apparatus as recited in claim 6 wherein the first annular heater and the second annular heater are electrical resistance elements.

8. The apparatus as recited in claim 6 wherein the first annular heater and the second annular heater are electrical induction susceptors.

* * * * *

UNITED STATES PATENT OFFICE
CERTIFICATE OF CORRECTION

PATENT NO. : 3,961,905
DATED : June 8, 1976
INVENTOR(S) : Dale W. Rice

It is certified that error appears in the above-identified patent and that said Letters Patent are hereby corrected as shown below:

Column 1, line 42, change second occurrence of "of" to -- or -- .

Column 2, line 57, change "surround" to -- surrounding -- .

Column 7, line 16, change "radically" to -- radially -- .

Signed and Sealed this

Twenty-first Day of September 1976

[SEAL]

Attest:

RUTH C. MASON
Attesting Officer

C. MARSHALL DANN
Commissioner of Patents and Trademarks